United States Patent [19]

Anderson et al.

[11] Patent Number: 4,994,995

[45] Date of Patent: Feb. 19, 1991

[54] BIT-SERIAL DIVISION METHOD AND APPARATUS

[75] Inventors: Robert W. Anderson, Morgan Hill; Ralph L. Gee; Trung L. Nguyen, both of San Jose; Martin A. Hassner, Palo Alto, all of Calif.

[73] Assignee: International Business Machines Corporation, Armonk, N.Y.

[21] Appl. No.: 493,568

[22] Filed: Mar. 14, 1990

[51] Int. Cl.$^5$ .................................................. G06F 7/00
[52] U.S. Cl. .................................. 364/746.1; 364/761
[58] Field of Search ....................... 364/746.1, 761, 765

[56] References Cited

U.S. PATENT DOCUMENTS 4,567,568  1/1986  Inagawa et al. ............. 364/746.1 X
4,574,361  3/1986  Inagawa et al. ..................... 364/746

FOREIGN PATENT DOCUMENTS 60-217440  10/1985  Japan ................................ 364/746.1

OTHER PUBLICATIONS

Whiting, "Bit-Serial Reed-Solomon Decoders in VLSI", PhD Thesis, submitted to California Institute of Technology on Aug. 22, 1984.
Howard M. Shao et al., "On the VLSI Design of a Pipeline Reed-Solomon Decoder Using Systolic Arrays", IEEE Transactions on Computers, vol. 37, No. 10, Oct. 1988.
Elwyn R. Berlekamp, Fellow, IEEE, "Bit-Serial Reed-Solomon Encoders", IEEE Transactions On Information Theory, vol. IT-28, No. 6, Nov. 1982.
In-Shek Hsu et al., "The VLSI Implementation of a Reed-Solomon Encoder Using Berlekamp's Bit-Serial Multiplier Algorithm" IEEE Transactions On Computers, vol. C-33, No. 10, Oct. 1984.
Charles C. Wang, et al., "VLSI Architectures for Computing Multiplications and Inverses in GF(2m)", IEEE Transactions on Computers, vol. C-34, No. 8, Aug. 1985.

Primary Examiner—Dale M. Shaw
Assistant Examiner—Tan V. Mai
Attorney, Agent, or Firm—Henry E. Otto, Jr.

[57] ABSTRACT

A bit-serial division method for computing the value v/u, where v and u are each n-bit vectors that are elements in a finite Galois field $GF(2^n)$ consisting of $2^n$ elements. The n-bit components of each element in the field are coordinates of the element in a canonical basis of the field. Vector u is converted from canonical basis to a dual basis. Vector u in dual basis also comprises n bits in the finite field ordered according to an index i that takes on values from 0 to (n−1). All bits n of the converted vector u are loaded into a shift register in parallel, then converted from dual basis back to canonical basis to produce a single bit output $w_0$ from a lookup table which generates bitwise the inverse of the n-bit vector u. The bits in the shift register are shifted (n−1) times to generate successive additional single bit outputs $w_i$ with said lookup table. Then each bit $w_i$ is multiplied by the vector v and a corresponding element $c_i$ in dual basis to generate a cumulative sum of these products that provides, upon completion of the (n−1) shifts, the bit-serial division result v/u.

10 Claims, 2 Drawing Sheets

BIT-SERIAL DIVISION METHOD AND APPARATUS

This invention relates to a method and apparatus for computing the result of the division of two finite elements in a Galois-Field (GF) in a bit-serial manner, and more particularly to such a method and apparatus wherein the elements of the finite field are generated in such manner as to provide an optimally hardware-efficient bit-serial division circuit

BACKGROUND OF THE INVENTION

Insofar as applicants are aware, no method or apparatus has heretofore described how to implement division in finite field arithmetic in a bit-serial manner.

A paper entitled "Bit-Serial Reed-Solomon Encoders" published in the IEEE Trans. on Information Theory in Vol. IT-28, dated November 1982 at pp. 869-874, discloses a method for multiplying. This method requires representation of one of the multiplicands in a so-called dual basis.

In his PhD thesis entitled "Bit-Serial Reed-Solomon Decoders in VLSI" submitted to California Institute of Technology in 1984, D. L. Whiting described a method for converting from canonical to dual basis for a GF($2^8$) implementation.

Other prior art of background interest includes

"The VLSI Implementation of a Reed-Solomon Encoder Using Berlekamp's Bit-Serial Multiplier Algorithm" IEEE Trans. on Computers, Vol. C-33, October 1984, pp. 906-911.

"VLSI Architecture for Computing Multiplications and Inverses in GF($2^m$)", IEEE Trans. on Computers, Vol. C-34 August 1985, pp. 709-717.

"On the VLSI Design of a Pipeline Reed-Solomon Decoder Using Systolic Arrays", IEEE Trans. on Computers, Vol. 37 October 1988, pp. 1273-1280.

There is a need for a method and apparatus for effecting bit-serial division in a hardware cost-efficient manner.

SUMMARY OF THE INVENTION

A bit-serial division method is disclosed for computing the value v/u, where v and u represent vectors in a canonical basis constituting elements in a finite field consisting of $2^n$ elements. Vector u is converted from the canonical basis to a dual basis. Then, all n bits of the converted vector u are loaded in parallel into a linear feedback shift register. This linear feedback is applied to the n-bit vectors produced after each shift. These vectors are finite field elements in the dual basis, generated as outputs of the linear feedback shift register. These outputs are then converted back from the dual basis to canonical basis and used as inputs to a trace function lookup table that takes n-bit inputs and produces 1-bit outputs.

The first bit $w_0$ output of the table is obtained from the vector u as an input, after being converted back to canonical basis representation. The bits in the shift register are then shifted (n−1) times to generate successive additional single bit outputs $w_i$ from the trace function table. Then each bit $w_i$ is multiplied by the vector v and the corresponding element in an optimized dual basis which is obtained after an appropriate normalization to generate a cumulative sum of these products that provides, upon completion of said number of shifts, the bit-serial division result v/u. The canonical basis consists of the consecutive powers of a finite field generator starting with the 0th power up to the (n−1)th power.

DESCRIPTION OF PREFERRED EMBODIMENT

Detailed Description

The bit-serial division apparatus and method according to the invention converts in a bit-serial manner a finite field element, the n-bit vector u, to 1/u and multiplies it in a bit-serial manner by an n-bit vector v to provide the quotient v/u.

Figure 1:
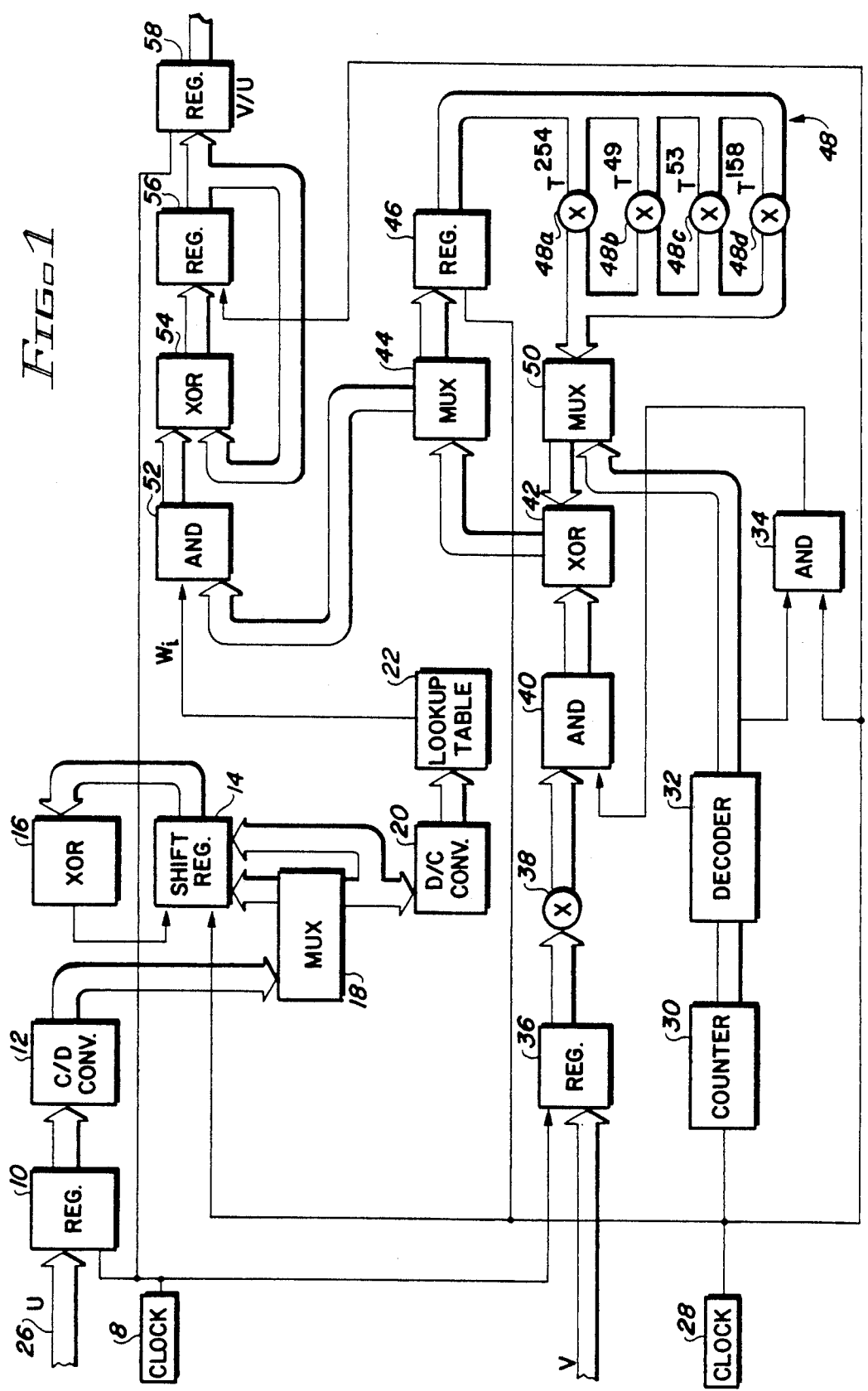
FIG. 1 is a schematic diagram depicting an apparatus embodying the invention for effecting bit-serial division.

As illustrated in FIG. 1, the apparatus embodying the invention comprises a main clock generator 8, an n-bit register 10, a C/D converted 12, a linear feedback shift register 14, an exclusive OR (XOR) circuit 16, a multiplexor 18, a D/C converter 20 and a trace function lookup table 22. Table 22 computes the trace function of the inverse value of its input. A clock generator 8 constitutes the main clock, the clocking rate of which is determined by the data rate. Generator 8 clocks the input 26 of n-bit vector u in canonical basis to n-bit register 10. As illustrated, n is assumed to be 8. A clock generator 28 generates clock cycles for controlling shifting of shift register 14 and other hardware presently to be described.

Figure 2:
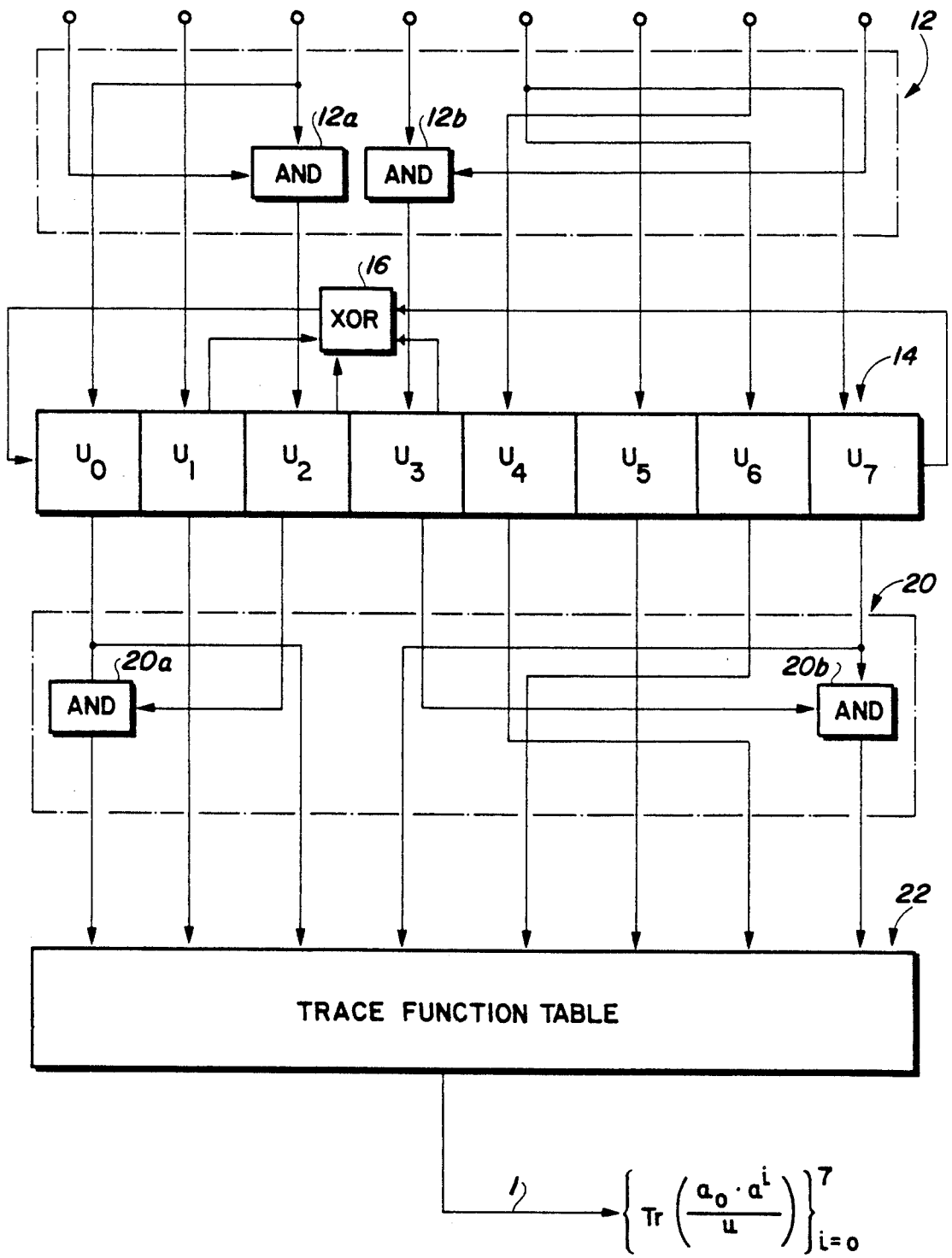
FIG. 2 is a diagram showing, in greater detail, the logic circuitry for the canonical-to-dual (C/D) converter, dual-to-canonical (D/C) converter, the linear feedback shift register, and trace function table depicted in FIG. 1.

As best shown in FIG. 2, the C/D converter 12 receives the n-bit vector u in canonical basis that is output from register 10 and, by means of AND gates 12a, 12b connected as shown, converts the n-bit vector u from the canonical to dual basis. As thus converted, the n-bit vector u is initially fed to linear feedback shift register 14 by way of multiplexor 18 in the manner hereinafter described. XOR circuit 16 then modifies the n-bit vectors (the 8-bit vectors $u_0$-$u_7$, as illustrated) stored in shift register 14 after each shift, thus generating internally finite field elements in the dual basis. Shift register 14 shifts its contents (n-1) times. After each shift, a new content of shift register 14 is mapped by D/C converter 20. Converter 20 comprises AND gates 20a, 20b connected as shown to convert the n-bit vector outputs from shift register 14 back into canonical basis. Lookup table 22 generates bitwise (i.e., one bit at a time) the inverse of said outputs, as denoted by the expression $$\left\{ Tr\left(\frac{a_0 a^i}{u}\right) \right\}_{i=0}^{7}$$

which is defined by Equation (3) in the Appendix.

Clock generator 28 drives a 3-bit counter 30 to produce n (8, as illustrated) distinct clock signals that are passed through a 3-bit decoder 32. Every eight clock cycles, when the output of decoder 32 is 000, AND gate 34 is activated to provide an output to AND gate 40. Multiplexor 18 initially allows the n-bit vector u to be entered into shift register 14 as above described, and then is switched once every 8 clock cycles to allow the contents to flow out from it to D/C converter 20.

As earlier stated, table 22 computes the trace function of the inverse value of its input. Table 22 is precomputed for a given finite field generator and it associates an output bit, either zero or one, with each finite field element input. All finite field elements are preferably normalized by a fixed finite field element selected such that the canonical and dual basis have the same, or almost the same, elements. This will minimize the hardware required for implementation of the circuit. The trace function is computed for a fixed normalizer, appropriately chosen.

The multiplication function is implemented by the apparatus now to be described. N-bit vector v, the multiplicand, is latched through a 3-bit register 36 and multiplied by a $T^2$ matrix multiplier 38. The binary matrix T represents the finite field generator "a", in the sense that multiplication of the n-bit vectors that represent the $2^n$ finite field elements by powers of this matrix is equivalent to multiplication of the corresponding finite field elements by the same powers of "a". The result of this multiplication is passed through an AND gate 40 where it is gated by an enable signal that is activated every 8 clocks and derived from the output of AND gate 34.

The output of AND gate 40 is routed to an XOR circuit 42, where it is initially added with zeroes and subsequently latched through a multiplexor 44 and a 3-bit register 46 to be multiplied in sequence by the multipliers 48a,b,c,d in a multiplier array 48 which are $T^{254}, T^{49}, T^{53}, T^{158}$, respectively. The results of this multiplication are eight vectors that represent $vT, vT^{50}, vT^{103}, vT^6, vT^5, vT^4, vT^3$. This, in effect, generates the products of the multiplicand, vector v, with the elements $c_i$ of an optimized dual basis. These eight vectors are routed through a multiplexor 50 and the XOR 42 and multiplexor 44 to AND gates 52 where they are ANDed to provide the products $w_i v T^j$, where j=2,1,150,103,6,5,4 and 3. Each subsequent product $w_i v T^j$ is XORed at 54 with the previous product stored in a register 56 until seven shifts have been completed. At that time, the contents, representing the final result v/u, are gated out to, and stored in, a register 58 in response to a clock signal from generator 28.

Normally, a n-bit vector in canonical basis would have a different representation or series of bits than in dual basis, and one of these representations would not be the inverse of the other. However, according to a feature of the invention, implementation in cost-efficient hardware is achieved by having the representation of vector u in canonical basis be almost a preselected permutation of that in the dual basis. (A precise preselected permutation is not possible). This almost dual basis herein referred to as the optimized dual basis is achieved by selecting an appropriate normalizing element in the finite field, such as shown in Equation (7) in the Appendix.

While the invention has been shown and described with respect to a preferred embodiment thereof, it will be understood by those skilled in the art that changes in form and detail may be made therein without departing from the scope and teaching of the invention. Accordingly, the method and apparatus herein disclosed are to be considered merely as illustrative, and the invention is to be limited only as specified in the claims.

APPENDIX

Derivation and Description of Algorithm to Compute v/u

Assume that $$u = \{u_0 u_1 u_2 u_3 u_4 u_5 u_6 u_7\} \quad (1)$$

$$v = \{v_0 v_1 v_2 v_3 v_4 v_5 v_6 v_7\} \quad (2)$$

and that a is the cyclic generator of $GF(2^8)$ where a is a root of the irreducible polynomial $X^8 + X^4 + X^3 + X^2 + (1::GF(2))$ with coefficients in GF(2). The canonical basis is $\{1,a,a^2,a^3,a^4,a^5,a^6,a^7\}$ in which each field element is described as a GF(2) vector of size 8. The elements u,v $GF(2^8)$ are given as vectors whose components are $u_i, v_i$ where $i = \{0, \ldots, 7\}$ in GF(2), assuming values of 0 or 1. To use bit-serial arithmetic it is necessary to convert u (or v) to a vector in the dual basis. The dual basis is orthogonal to the canonical basis with respect to the trace function $$Tr(X) = \sum_{i=0}^{7} X^{2^i}, X \, GF(2^8) \quad (3)$$

The Canonical Polynomial Basis $$CB := \{1,a,a^2,a^3,a^4,a^5,a^6,a^7\} \quad (4)$$

is converted to dual basis $$DB := \{a^{252}, a^{251}, a^{45}, a^{98}, a, 1, a^{254}, a^{253}\} = \quad (5)$$
$$\{a^7 + a^5 + a^3 + a^2 + 1, a^7 + a^6 +$$
$$a^4 + a^3, a^7 + a^6 + 1, a^6 + a + 1, a,$$
$$1, a^7 + a^3 + a^2 + a, a^6 + a^2 + a + 1\}$$

To verify that the computed bases are correct, an orthogonality check is made, as follows: Orthogonality check = $\{\{trace(DB.jCB.i) \text{ for i in } 0..7\} \text{ for j in } 0..7\}$ $$\{\{1,0,0,0,0,0,0,0\},\{0,1,0,0,0,0,0,0\},$$
$$\{0,0,1,0,0,0,0,0\},\{0,0,0,1,0,0,0,0\},$$
$$\{0,0,0,0,1,0,0,0\},\{0,0,0,0,0,1,0,0\},$$
$$\{0,0,0,0,0,0,1,0\},\{0,0,0,0,0,0,0,1\}\} \quad (6)$$

The problem with this dual basis is that its elements are different (except for 2) than the elements in the canonical basis. The most desirable situation would be to have a self-dual basis since the cost of conversion would then be zero. Unfortunately, such a basis does not exist for $GF(2^8)$. However for the particular realization $a | a^8 + a^4 + a^3 + a^2 + (1::GF(2))$, the dual basis can be made "almost" self-dual (i.e., an optimized self-dual) by dividing its elements by the fixed element $a^{-5}$. This is the best almost self-dual basis for $GF(2^8)$ since there are only two elements in it that are not included in the canonical basis.

$$a0 := a^{(-5)} =$$
$$a^6 + a^5 + a^3 + a^2 \quad (7)$$

$WB := \{DB.i/a0 \text{ for i in } 0..7\}$ $$\{a^2, a, a^2 + 1, a^7 + a^3, a^6, a^5, a^4, a^3\} \quad (8)$$

This desirably produces the most hardware-efficient implementation of the algorithm for bit-serial division computation of v/u.

We claim:

1. A bit-serial division method for computing the value v/u, where v and u each are n-bit vectors that are elements in a finite Galois field $GF(2^n)$ consisting of $2^n$ elements and wherein the n-bit components of each element in said field are the coordinates of such element in a canonical basis of said field, comprising the steps of:

converting the vector u from the canonical basis to a dual basis, said vector u in said dual basis also comprising n bits ordered according to an index i that takes on values from 0 to $(n-1)$;

loading into a shift register in parallel all bits n of the converted vector u;

converting the converted n-bit vector u from the dual basis back to canonical basis to produce a single bit output $w_O$ from a lookup table which generates bitwise the inverse of the n-bit vector u;

shifting the bits in the shift register $(n-1)$ times to generate successive additional single bit outputs $w_i$ with said lookup table; and then multiplying each bit $w_i$ by the vector v and a corresponding element $c_i$ in dual basis to generate a cumulative sum of these products that provides, upon completion of said $(n-1)$ shifts, the bit-serial division result v/u.

2. The method of claim 1, wherein the n-bit vector u in canonical basis consists of the consecutive powers of a finite field generator starting with the 0th power up to the $(n-1)$th power.

3. The method of claim 1, wherein the shift register is a linear feedback register, and including the steps of:

providing a polynomial function of a single variable whose roots generate the finite field;

wiring the shift register according to a preselected polynomial obtained from said polynomial function by substituting into said function the inverse of the variable; then normalizing by a power of the variable sufficiently large to eliminate all fractions; and using the shift register, computing and updating at each shift the values of converted n-bit vector u.

4. The method of claim 1, including the steps of:

normalizing all $2^n$ elements in the finite field by multiplying said $2^n$ elements by a constant chosen to minimize the cost of implementation in hardware.

5. The method of claim 1, including the step of computing the lookup table by evaluating a trace function of all said $2^n$ elements in the finite field.

6. The method of claim 1, wherein n is 8.

7. The method of claim 1, wherein the finite field is generated by a primitive root a of an irreducible polynomial $X^8+X^{4'}X^3+X^2+1$ with GF(2) coefficients to provide an optimally hardware efficient bit-serial division circuit.

8. A bit-serial division method for computing the value v/u, where v and u each are n-bit vectors that are elements in a finite Galois field $GF(2^2)$ consisting of $2^n$ elements and wherein the n-bit components of each element in said field are the coordinates of such element in a canonical basis of said field, comprising the steps of:

converting the n-bit vector u from the canonical basis representation to an n-bit vector in an optimized dual basis chosen to minimize the cost of implementation in hardware, said vector u in said dual basis also comprising n bits ordered according to an index i that takes on values from 0 to $(n-1)$;

loading in parallel the n-bits of vector u into a linear feedback shift register that operates over the optimized dual basis;

converting the n-bit vector u stored in the linear feedback shift register back to canonical basis to produce a single bit output $w_O$ from a lookup table which generates bitwise the inverse of the n-bit vector u;

shifting the bits in the shift register $(n-1)$ times to generate successive additional single bit outputs $w_i$ with the lookup table; and then multiplying each bit $w_i$ by the vector v and a respective element $c_i$, where $c_i$ is the corresponding finite field element in the optimized dual basis, to produce a cumulative sum of these products that provides, upon completion of said $(n-1)$ shifts, the bit-serial division result v/u.

9. The method of claim 8, including during the second-mentioned converting step, normalizing all $2^n$ elements of said finite field to the optimized dual form by multiplying said all elements by a fixed element.

10. The method of claim 8, wherein n is 8.

* * * * *